United States Patent [19]

Schneller et al.

[11] Patent Number: 4,822,719
[45] Date of Patent: Apr. 18, 1989

[54] RADIATION-SENSITIVE MIXTURE, RADIATION-SENSITIVE RECORDING MATERIAL CONTAINING SAID MIXTURE, AND PROCESS FOR PREPARING RELIEF IMAGES

[75] Inventors: Arnold Schneller, Mainz; Ralf Schulze, Frankfurt; Jürgen Sander, Liederbach; Kurt Erbes, Floersheim, all of Fed. Rep. of Germany

[73] Assignee: Hoechst Aktiengesellschaft, Fed. Rep. of Germany

[21] Appl. No.: 895,906

[22] Filed: Aug. 13, 1986

[30] Foreign Application Priority Data

Aug. 13, 1985 [DE] Fed. Rep. of Germany ....... 3528929

[51] Int. Cl.4 .............................................. G03C 1/495
[52] U.S. Cl. ..................................... 430/270; 430/192; 430/196; 430/175; 430/326
[58] Field of Search ............... 430/326, 270, 192, 196, 430/175

[56] References Cited

U.S. PATENT DOCUMENTS

| | | | |
|---|---|---|---|
| 3,409,589 | 11/1968 | Kine | 260/47 |
| 3,869,292 | 3/1975 | Peters | 96/115 R |
| 4,025,710 | 5/1977 | Stolka et al. | 526/284 |
| 4,263,394 | 4/1981 | Gates et al. | 430/287 |
| 4,384,037 | 5/1983 | Hosaka et al. | 430/191 |
| 4,421,844 | 12/1983 | Buhr et al. | 430/176 X |
| 4,439,516 | 3/1984 | Cernigliaro et al. | 430/323 |
| 4,458,000 | 7/1984 | Stahlhofen | 430/270 X |
| 4,467,027 | 8/1984 | Yamamoto et al. | 430/278 X |
| 4,506,003 | 3/1985 | Ruckert et al. | 430/270 |
| 4,506,006 | 3/1985 | Ruckert | 430/270 X |
| 4,572,887 | 2/1986 | Geissler | 430/288 |
| 4,678,737 | 7/1987 | Schneller et al. | 430/270 |
| 4,699,867 | 10/1987 | Schneller et al. | 430/192 |

FOREIGN PATENT DOCUMENTS 0109194 3/1976 Japan .................. 430/192
0041052 10/1977 Japan .

OTHER PUBLICATIONS

Julius Grant, ed, *Hackh's Chemical Dictionary*, 3rd ed., McGraw-Hill Book Company, Inc., New York, N.Y., 1944, p. 33.

*Primary Examiner*—Paul R. Michl
*Assistant Examiner*—Cynthia Hamilton
*Attorney, Agent, or Firm*—Foley & Lardner, Schwartz, Jeffery, Schwaab, Mack, Blumenthal & Evans

[57] ABSTRACT

A radiation-sensitive mixture which contains
(A) a polymer comprised of repeat units represented by the formula

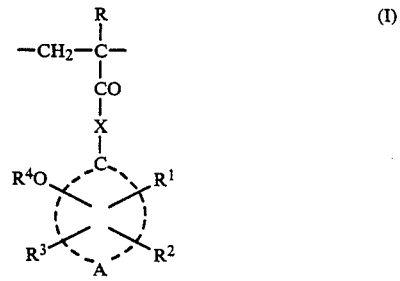

where
R is a hydrogen or a halogen atom, a cyanide group or an alkyl group of 1-4 carbon atoms,
$R^1$, $R^2$ are identical or different, and each and $R^3$ denotes a hydrogen or a halogen atom, an alkyl group, an alkoxy group, an alkoxycarbonyl group, an acyl group, an aryloxy group, an aroyl group or aralkyl group,
$R^4$ is a hydrogen atom or a divalent organic group which is linked to another unit represented by formula (I),
X denotes an oxygen atom or one of the groups $NR^8$, $OCH_2CHOHCH_2OCO$, $OCH_2CH_2O$ and $OCH_2CH_2OCO$, where $R^8$ is a hydrogen atom, alkyl or aryl group and
A denotes the atoms required for completing a mononuclear or dinuclear carbocyclic or heterocyclic aromatic ring system,
(B) a combination of
 (a) a compound which forms a strong acid under the action of actinic radiation and
 (b) a compound which has at least one acid-cleavable C—O—C bond and the solubility of which in a liquid developer is increased by the action of acid, is suitable for preparing printing plates and dry photoresists.

7 Claims, No Drawings

RADIATION-SENSITIVE MIXTURE, RADIATION-SENSITIVE RECORDING MATERIAL CONTAINING SAID MIXTURE, AND PROCESS FOR PREPARING RELIEF IMAGES

BACKGROUND OF THE INVENTION

The present invention relates to radiation-sensitive mixtures which are particularly suitable for preparing photoresist stencils and printing plates. The present invention relates in particular to positive-working radiation-or light-sensitive mixtures based on combinations of photolytically activatable acid donors with acid-cleavable compounds and water-insoluble binders which are soluble in aqueous alkaline solutions.

Positive-working light-sensitive mixtures of the aforesaid constituents, i.e., mixtures whose copying layer becomes soluble in the exposed areas are known. In the vast majority of cases, these mixtures contain phenol-formaldehyde condensation products, in particular novolaks as alkali-soluble binders. Also used for this purpose are copolymers of maleic anhydride and styrene, of vinyl acetate and crotonic acid, of alkyl methacrylate, butadiene and methacrylic acid (German Offenlegungsschrift No. 3,107,526) and polymers of vinylphenol (German Offenlengungsschfift No. 3,309,222). These polymers are evidently not preferred, since practically all known commecial products contain novolaks. Nevertheless, novolaks used as binders present disadvantages for certain purposes.

For use as binders in dry resist coatings, novolaks are too brittle because of their low molecular weight, so that a novolak-containing layer frequently breaks during processing. Layer breakage can occur, for example, in the course of exposure when the layer is in contact with a mask, or in the course of lamination when the layer is applied as a dry resist to a base material surface. Layer brittleness, which is particularly noticeable in the case of the higher layer thicknesses preferred for dry resist materials, is caused by a plurality of factors. First, the incorporation of aromatic groups in the main chain substantially restricts the mobility of the main chain, which effect manifests itself in a high glass transition temperature and low flexibility. Secondly, due to the polyfunctionality of the compounds used, the condensation of phenols or cresols with formaldehyde under acid conditions, which is customarily used for the synthesis of novolaks, leads only to products having a low molecular weight an/or a high degree of branching or cross-linking.

Because of these novolak-specific disadvantages, the film-forming capacity and flexibility of such compounds is too low to permit their use, in combination with light-sensitive systems, in preparing dry resist films which can be satisfactory processed from a roll, without breaking of the layer or delaminating of resist to the protective film.

Novolak brittleness is also the reason for processing problems encountered when using these binders in microelectronics. During exposure which entails intimate contact with a mask, breaks or cracks often appear in the layer.

European patent application No. 0 042 562 discloses a corresponding light-sensitive mixture which, to increase the flexibility of the layer and to improve other properties, contains another polymer, for example a polyurethane, a polyvinyl alkyl ether, a polyalkyl acrylate or a hydrogenated colophony derivative, in addition to the alkali-soluble novolak. But the addition of these resins, which have a different solubility behavior than novolaks, has an adverse effect on other properties, such as developability, acid and alkali resistance of the image stencil.

It has therefore been proposed to replace the novolak in positive-working layers with another alkali-soluble binder. Polyvinylphenol is disclosed for this purpose in German Patentschrift No. 2,322,230, that is, as a novolak replacement, in layers that contain o-quinonediazides. Although the plasma resistance and the adhesion to silicon surfaces are basically comparable to novolaks, unexposed photoresist layers based on this polymer are excessively eroded in the course of development. It is true that the degree of erosion decreases with increasing molecular weight, but in the best cases (molecular weight ≃25,000) it is still higher than in the case of novolak-based layers by a factor of approximately 100 (according to T. R. Pampalone, Solid State Technology, June, 1984 at page 119). A further disadvantage is the preparatively expensive synthesis and the low polymerization tendency of monomeric vinylphenol.

Japanese Kokai No. 51/36,129 describes the use as binders of polymers based on hydroquinone monomethacrylate and dihydroxynaphthalene monomethacrylate in naphthoquinonediazide layers.

All these mixtures with o-quinonediazides as light-sensitive compounds have the disadvantage, compared with mixtures with the acid-cleavable compounds mentioned above, of a distinctly lower light sensitivity. This is particularly evident in uses where higher layer thicknesses are required, for example, in dry resist processes.

SUMMARY OF THE INVENTION

It is therefore an object of the present invention to provide positive-working mixtures of the sort described above that can be used to prepare light-sensitive layers which can be developed with aqueous alkaline solutions and which display increased photosensitivity and flexibility, relative to layers prepared with conventional mixtures.

It is also an object of the present invention to provide a radiation-sensitive recording material which combines high resistance to processing media, such as developing and etching solutions, with excellent light-sensitivity.

It is yet another object of the present invention to provide a process for preparing relief images which does not entail the excessive erosion of unexposed photosensitive surfaces in the course of development.

In accomplishing the foregoing objects, there has been provided, in accordance with one aspect of the present invention, a radiation-sensitive mixture comprising (A) a water-insoluble polymeric binder which is soluble in aqueous alkaline solutions and has phenolic hydroxyl side groups and (B) a combination of (1) a compound which forms a strong acid under the action of actinic radiation and (2) a compound which has at least one acid-cleavable C—O—C bond and the solubility of which in a liquid developer is increased by the action of acid, wherein the binder comprises a polymer comprised of repeat units represented by the formula (I)

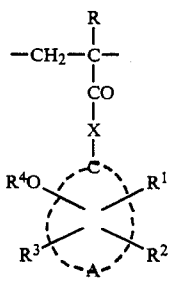

(I)

where
R is a hydrogen or a halogen atom, a cyanide group or an alkyl group of 1–4 carbon atoms,
$R^1$, $R^2$ and $R^3$ are identical or different, and each and $R^3$ denotes a hydrogen or a halogen atom, an alkyl group, an alkoxy group, an alkoxycarbonyl, an acyl group, an aryloxy group, an aroyl group or aralkyl group,
$R^4$ is a hydrogen atom or a divalent organic group which is linked intermolecularly or intramolecularly to another unit represented by formula (I), $R^4$ being a hydrogen atom, in at least 80 mol-% on average of units represented by formula (I),
X denotes an oxygen atom or one of the groups $NR^8$, $OCH_2CHOHCH_2OCO$, $OCH_2CH_2O$ and $OCH_2CH_2OCO$, where $R^8$ is a hydrogen atom, an alkyl or aryl group and
A denotes the atoms required for completing a mononuclear or dinuclear carbocyclic or heterocyclic aromatic ring system.

There has also been provided, in accordance with another aspect of the present invention, a radiation-sensitive recording material that comprises a base material and a radiation-sensitive recording layer provided on the base material, which recording layer is comprised of the radiation-sensitive mixture described in the preceding paragraph.

In accordance with yet another aspect of the present invention, there has also been provided a process for preparing relief images, comprising the steps of (1) imagewise irradiating a radiation-sensitive recording material as described above with actinic radiation such that the solubility of the recording layer in an aqueous-alkaline developer solution increases and (2) removing irradiated portions of the recording layer by means of an aqueous-alkaline developer solution.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A polymer according to the present invention can be a homopolymer or a copolymer which, in addition to units represented by formula (I), contains other units derived from copolymerizable ethylenically unsaturated monomers. The comonomers are in general monovinyl compounds. They can also contain crosslinkable groups which can be crosslinked catalytically or thermally. The crosslinking can be effected in the course of curing the image stencil after developing, preferably by heating.

When R is an aliphatic hydrocarbon group in the formula (I), the aliphatic hydrocarbon group generally contains 1 to 6, preferably 1 or 2, carbon atoms. Particular preference is given to compounds with R=H or methyl.

It is preferable that at least one of the substituents $R^1$, $R^2$ and $R^3$ is a hydrogen atom, and it is particularly preferred that at least two of these substituents are hydrogen atoms. When one or more of $R^1$ through $R^3$ denote a hydrocarbon group, this has preferably 1 to 6, in particular 1 to 3, carbon atoms.

In this regard a hydrocarbon group is a group selected from branched and unbranched, saturated and unsaturated groups with cyclic and open chains which can be substituted by halogen atoms or hydroxyl groups, or which contain ether or keto groups. Preference is given to unbranched, in particular saturated, hydrocarbon radicals having 1 to 3 carbon atoms.

When the aromatic ring system A is heterocyclic, it can be, for example, a pyridine, a pyrimidine, a pyrazine, a quinoline, an isoquinoline, a quinoxaline, an indole or a thiophene system. Suitable aromatic ring systems are benzene, naphthalene and biphenyl; particular preference is given to a benzene ring.

The position of the $OR^4$ groups is not subject to any restrictions; it depends on the preparative accessibility. In any event, the position of the radicals $R^1$, $R^2$ and $R^3$ depends on the position of the $OR^4$ groups.

When $R^4$ is a divalent group, it is present in the polymer in such an amount as not to impair the solubility of the product. In general, no more than 20 mol-%, preferably no more than 10 mol-%, of the units of formula (I) contain an $R^4O$ group in which R4 is different from H. R4 can in this case be an aromatic or aliphatic group which preferably contains 2 to 15 carbon atoms, and could have been formed, by example, by reacting a diepoxide or diisocyanate with OH groups. The preferred reactants are diisocyanates. Examples of suitable diisocyanates are tolylene, hexamethylene, 2,2,4-trimethylhexamethylene, lysine, isophorone and diphenylmethane diisocyanates.

Examples of units of formula (I) that are suitable for use in the present invention are those of monoacrylates or monomethacrylates of hydroquinone, of pyrocatechol, of resorcinol, of methylresorcinol, of chlororesorcinol, of ethylhydroquinone, of 2,3-dihydroxynaphthalene, of 4,4'-dihydroxybiphenyl, of 2,2-bis-(4-hydroxyphenyl)propane, of 5,8-dihydroxyquinoline, of β-hydroxyethyl salicylate, of β-hydroxyethyl 2-hydroxy-3-naphthoate, of 2,3-dihydroxypropyl 4-chloro- or -4-bromo-salicylate, of 4,4'-dihydroxybenzophenone and of 2,4-dihydroxyacetophenone. Further examples are units of (meth)acrylamides of o-, m- or p-aminophenol and of 1-amino-7-naphthol.

Monomers of the type conforming to formula (I) can be prepared, for example, by reacting optionally substituted hydrobenzoic acids with hydroxyalkyl acrylate or methacrylate, with glycidyl acrylate or methacrylate, or by esterifying or amidating acrylic or methacrylic acid with appropriately substituted phenols.

The homopolymerization of these monomers, or their copolymerization with other monomers, can be carried out by conventional methods, for example, in the presence of a polymerization initiator such as azobisisobutyronitrile in organic solvents such as butanone or ethanol at elevated temperatures over 1 to 20 hours. But, it is also possible to effect a suspension, emulsion or mass polymerization which can be initiated by radiation, heat or ionic initiators.

The polymers of units of formula (I) can be homopolymers that contain only structural units of formula (I), or copolymers of monomers conforming to formula (I) and one or more other vinyl monomers, including, where appropriate, those having phenolic groups. It is also possible to copolymerize different monomers conforming to formula (I) with one another, and also, where appropriate, with other vinyl monomers.

The molecular weight of the homopolymers and copolymers can be varied within wide limits; preference is given to polymers with $\overline{M}_n = 1000-200,000$, in particular those with $\overline{M}_n = 5000-100,000$. The hydroxyl number is in general within the range from 100 to about 450, preferably between 200 and 350.

The choice of suitable homopolymers and copolymers depends in any given case on the intended purpose and on the nature of the other components in the radiation- or light-sensitive mixture. For instance, the hydrophilic character of the binder of a light-sensitive mixture is of importance for the light sensitivity, developing time and developer resistance. The hydrophilic character must therefore be adapted to the particular light-sensitive system.

The application properties of a light-sensitive mixture are further governed by its softening temperature, which is essentially determined by that of the binder. The softening temperature of the binder can be affected through choice of the substituents on the aromatic nucleus and in particular through the choice of the comonomers.

Preferred comonomers for the compounds that polymerize to give units of formula (I) are compounds represented by the formula

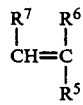

where $R^5$ is a hydrogen or a halogen atom or an aliphatic hydrocarbon group, $R^6$ is an aliphatic hydrocarbon acyl, acyloxy, aryl, formyl, cyanide, carboxyl, hydroxyl or aminocarbonyl group and $R^7$ is a hydrogen atom or a carboxyl group which can be bonded to $R^6$, when the latter is a carboxyl group, to form an acid anhydride.

When $R^5$ or $R^6$ are aliphatic hydrocarbon, they generally have 1-4 carbon atoms; suitable representatives of $R^6$ are alkoxy groups having 1-8 carbon atoms, alkyloxycarbonyl groups having 2-13 carbon atoms, acyl groups having 2-20 carbon atoms and acyloxy groups having 2-18 carbon atoms and aryl groups have 6-10 carbon atoms. The aminocarbonyl groups can be unsubstituted or be substituted by one or two alkyl groups having 1-8 carbon atoms, where the term "aliphatic hydrocarbon groups" has the above-mentioned meaning. Examples of such compounds are styrene, α-chlorostyrene, α-methylstyrene, 2-, 3- or 4-chloromethylstyrene, 4-bromostyrene, methyl vinyl ether, ethyl vinyl ether, propyl vinyl ether, butyl vinyl ether, acrylonitrile, acrolein, butadiene, acrylic acid, methacrylic acid, the methyl, ethyl, propyl, butyl, pentyl, hexyl, decyl, dodecyl, 2-ethylhexyl, phenyl, benzyl, biphenylyl and naphthyl esters of these acids, methacrylamide, acrylamide, vinyl acetate, vinyl isobutyl ketone and maleic anhydride.

The content of units of formula (I) in a copolymer of the present invention depends on the other components of the mixture and the use intended for the mixture. In general, polymers used in the mixture according to the present invention contain 20 to 100 mol-%, preferably 40 to 100 mol-% of formula (I) units.

To prepare the mixtures according to the present invention, the binder described above is combined with radiation-sensitive combinations of photolytic acid donors with acid-cleavable compounds whose solubility in an aqueous alkaline developer solution is increased on exposure to light or high-energy radiation.

Representatives of suitable acid-cleavable compounds are primarily:

(a) those with at least one orthocarboxylic acid ester and/or carboxylic acid amide acetal grouping, it being possible for the compounds also to have polymeric character and for the groupings mentioned to appear as linking elements in the main chain or as lateral substituents, (b) oligomer or polymer compounds having recurring acetal and/or ketal groupings in the main chain, and (c) compounds having at least one enolic ether or N-acyl-iminocarbonate grouping. Acid-cleavable compounds of type (a) are components of radiation-sensitive mixtures described in detail in European patent application No. 0 022 571; mixtures that contain compounds of type (b) are described in German Patentschriften No. 2,306,248 and No. 2,718,254; and compounds of type (c) are described in European applications No. 0 006 626 and No. 0 006 627.

The nature and amount of binder and of cleavable compound, respectively, can vary according to the intended use; preference is given to binder contents between 30 and 90% by weight, in particular 55 to 85% by weight. The amount of cleavable compound can be varied between 5 and 70% by weight, preference being given to the range from 5 to 40% by weight.

It is also possible to include many other oligomers and polymers, such as phenolic resins of the novolak type and vinyl polymers, for example, polyvinyl phenols, polyvinyl acetals, polymethacrylates, polyacrylates, polyvinyl ethers and polyvinylpyrrolidones, which can themselves have been modified by comonomers. The most favorable amount of these additives depends on the application requirements and on their effect on developing conditions; in general, the amount is no more than 30% of the polymer of units of formula (I). For specific requirements such as flexibility, adhesion, gloss and the like, the light-sensitive layer can additionally contain, in small amounts, substances such as polyglycols, cellulose ether (for example, ethyl cellulose), wetting agents, levelling agents, dyes and finely-divided pigments.

Suitable radiation-sensitive components that on irradiation preferably form or eliminate strong acids comprise a large group of known compounds and mixtures, such as diazonium, phosphonium, sulfonium and iodonium salts; halogen compounds; o-quinonediazidesulfochlorides and organometal-organohalogen combinations. The aforementioned diazonium, phosphonium, sulfonium and iodonium compounds are generally used in the form of their salts which are soluble in organic solvents, usually as deposition products with complex acids such as hydroborofluoric acid, hexafluorophosphoric, hexafluoroantimonic and hexafluoroarsenic acid.

In principal, the halogen-containing, radiation-sensitive compounds that form halohydric acid can be any organic halogen compound also known as a photochemical free-radical initiator, for example, those compounds having more than one halogen atom on a carbon atom or on an aromatic ring. Examples are described in U.S. Pat. Nos. 3,515,522, 3,536,489 and 3,779,778, in German Patentschrift No. 2,610,842 and in German Offenlegungsschriften No. 2,243,621, No. 2,718,259 and No. 3,337,024. Of these compounds, preference is given to the s-triazine derivatives with two halogenomethyl groups, especially trichloromethyl groups, and an aromatic or unsaturated substituent in the triazine nucleus, which compounds are described in German Offenlegungsschriften No. 2,718,259 and No. 3,337,024. The action of these halogen-containing compounds can also be spectrally affected and enhanced by known sensitizers.

Examples of suitable initiators are: 4-(di-n-propylamino)-benzenediazonium tetrafluoroborate, 4-p-tolylmercapto-2,5-diethoxybenzenediazonium hexafluorophosphate and tetrafluoroborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis-dibromomethylbenzene, tris-dibromomethyl-s-triazine, 2-(6-methoxynaphth-2-yl)-, 2-(naphth-1-yl)-, 2-(naphth-2-yl)-, 2-(4-ethoxy-ethylnaphth-1-yl)-, 2-benzopyran-3-yl)-, 2-(4-methoxyantrac-1-yl-, 2-(4-styrylphenyl)-, 2-(phenathr-9-yl)-4,6-bis-trichloromethyl-s-triazine, and the compounds listed in the following examples.

The amount of initiator can likewise vary very widely according to its chemical nature and the composition of the mixture. Favorable results are obtained with about 0.1 to 10% by weight, preferably 0.2 to 5% by weight, based on the total solids. Particularly for copying layers over 10 μm in thickness, it is advisable to use relatively less acid donor.

Finally, the light-sensitive mixture can also contain soluble or finely-divided, dispersible dyes and, depending on the intended use, UV absorbers. Suitable dyes include the triphenylmethane dyes, especially in the form of their carbinol bases. The most favorable mixing ratios of the components can easily be determined in the individual case by means of preliminary experiments.

Suitable base materials for the light-sensitive mixtures are all materials customarily used in the art in copying processes. Examples which may be mentioned are plastic films, insulating sheaths with copper layer, mechanically or electrochemically roughened and optionally anodized aluminum, screen-printing stencil supports, wood, ceramics, glass, and silicon with a surface which can have been chemically converted, for example, into silicon nitride or silicon dioxide.

Preferred base materials for thick layers over 10 μm are plastic films, which then serve as temporary base materials for transfer layers. For this purpose and for color films, preference is given to polyester films, such as polyethylene terephthalate. Polyolefin films like polypropylene are also suitable. The base materials used for layer thicknesses below about 10 μm are usually metals. In the case of offset printing plates it is possible to use mechanically or chemically roughened and optionally anodized aluminum which can, in addition, have been chemically pretreated, for example, with polyvinylphosphonic acid, silicates or phosphates.

Finally, coating can be effected directly or by layer transfer from temporary base materials onto circuit board materials that comprise insulating boards with a copper layer on one or both sides, onto glass or ceramic materials that may have been given a tackifying pretreatment, and onto silicon wafers. It is also possible to coat wood, textiles and surfaces of many materials that are advantageously imaged by projection and resistant to the action of alkaline developers.

For the drying after coating, it is possible to adopt the customary equipment and conditions, temperatures around 100° C. and briefly up to 120° C. being withstood without loss of radiation sensitivity.

Exposure can be effected with the customary light sources such as fluorescent lamps; xenon pulsed lamps; metal halide doped mercury vapor high-pressure lamps; and carbon arc lamps. For the purposes of this description, "irradiation" pertains to the action of actinic electromagnetic radiation in the wavelength region below about 500 nm. All the radiation sources that emit in this wavelength region are suitable for use with the present invention.

It is advantageous to use laser irradiators, in particular automatic processing systems, which contain as the source of radiation an argon ion laser. Irradiation can also be effected with electron beams. In this case it is also possible to use compounds which, in the customary sense, are not light-sensitive, but form acid, as initiators of the solubilizing reaction; for example, halogenated aromatic compounds or halogenated polymeric hydrocarbons are suitable in this regard. X- or ion rays can likewise be used for image generation.

The imagewise exposed or irradiated layer can be removed in a conventional manner with the developers known for use with commercially available naphthoquinonediazide layers and photoresists. The copying behavior of the new materials of the present invention can be adapted advantageously to the known auxiliaries, such as developers and programmed spray development apparatus. The aqueous developer solutions can contain, for example, alkali metal phosphates, silicates and hydroxides, and also wetting agents as well as, if desired, minor amounts of organic solvents. In certain cases even solvent-water mixtures are usable as a developer. The choice of the most favorable developer can be determined by experiments on the particular layer used. If necessary, the development can also be aided mechanically.

In the case of using a compound of the present invention to prepare printing plates, the developed plates can be briefly heated to elevated temperatures to increase the durability in printing and the resistance to washing-out agents, correcting agents and UV-curable printing inks, as known for diazo layers from British patent application No. 1,154,749.

The present invention also provides a process for preparing relief images by imagewise irradiating a radiation-sensitive recording material comprised of a base material and a recording layer as described above, which process comprises exposing the layer to actinic radiation in such an amount that the solubility of the layer increases in an aqueous alkaline developer solution. The irradiated parts of the layer, which contains as binder a polymer comprising units of formula (I), are then removed by means of an aqueous alkaline developer solution.

The present invention makes possible the obtaining of positive layers whose properties are adjustable in a controlled manner according to the application requirements. Through suitable choice of the binders of the present invention, it is possible, for example, to obtain thin, positive layers which have excellent adhesion to the substrate and outstanding temperature, etch and abrasion stability.

On the other hand, the binders of the present invention can also be used to obtain positive layers for use in higher layer thicknesses of about 15 μm to 100 μm or more, for example, as dry resists. These dry films have a high light sensitivity and an excellent flexibility, and can be satisfactorily processed from the roll. After dry transfer, they adhere well to metallic base materials and, even in the case of higher layer thicknesses, exhibit no cracks or breaks in the layer. In particular, on cutting there is an absence of splintering of parts of the layer.

The examples below illustrate the possibilities for carrying out the image recording process of the present invention, and for preparing and using the binders in mixtures according to the present invention. Percentages and weights reported below are by weight unless otherwise stated. Parts by weight (pbw) relate to parts by volume (pbv) as the g relates to the ml.

The following coating solutions were prepared for various application possibilities:

| Coating Solution A: | | |
|---|---|---|
| 40 | pbw | of binder, |
| 10 | pbw | of polyacetal of triethylene glycol and butyraldehyde, |
| 0.5 | pbw | of 2-(4-ethoxynaphth-1-yl)-4,6-bis-trichloro-methyl-s-triazine and |
| 0.05 | pbw | of crystal violet base in |
| 110 | pbw | of butanone. |
| Coating Solution B: | | |
| 40 | pbw | of binder, |
| 8 | pbw | of a polymeric orthoester prepared by condensing trimethyl orthoformate with 4-oxa-6,6-bis-hydroxymethyl-octan-1-ol, |
| 0.5 | pbw | of 2-(4-styrylphenyl)-4,6-bis-trichloromethyl-s-triazine and |
| 0.05 | pbw | of crystal violet base in |
| 80 | pbw | of butanone and |
| 20 | pbw | of ethanol. |
| Coating Solution C: | | |
| 10 | pbw | of binder, |
| 3 | pbw | of the bis-(5-buty-5-ethyl-1,3-dioxan-2-yl) ether of 2-butyl-2-ethylpropanediol and |
| 0.25 | pbw | of 2-(acenapth-5-yl)-4,6-bis-trichloromethyl-s-triazine in |
| 90 | pbw | of butanone. |
| Coating of Solution D: | | |
| 20 | pbw | of binder, |
| 6.5 | pbw | of a cresol-formaldehyde novolak with a softening range of 105–120° C., |
| 3.5 | pbw | of the polyacetal used in coating solution A and |
| 0.5 | pbw | of 2-(4-ethoxy-naphth-1-yl)-4,6-bis-trichloro-methyl-s-triazine in |
| 70 | pbw | of a solvent mixture of 1-methoxypropan-2-ol, butyl acetate and xylene (8:1:1). |
| Coating Solution E: | | |
| 8 | pbw | of binder, |
| 1 | pbw | of the polyacetal of coating solution A, |

-continued

| 0.5 | pbw | 2-(4-styrylphenyl)-4,6-bis-trichloromethyl-s-triazine and |
|---|---|---|
| 0.05 | pbw | of crystal violet base in |
| 80 | pbw | of 1-methoxy-2-propanol and |
| 20 | pbw | of butyl acetate. |

EXAMPLES 1 TO 4

To prepare offset printing plates, each of the following binders was mixed, in accordance with the directions concerning coating solution E, with the components indicated for that coating solution:

(a) a copolymer of pyrocatechol monomethacrylate and methylmethacrylate (90:10 mol-%, RSV value: 0.438 dl/g in dimethylformamide), (b) copolymer of hydroquinone monomethacrylate and butyl methacrylate (70:30 mol-%, RSV value: 0.365 dl/g in dimethylformamide), (c) copolymer of methyl methacrylate and the reaction product of hydroxyethyl methacrylate and salicylic acid (80:20 mol-%, RSV value: 0.511 dl/g in dimethylformamide) and (d) copolymer of p-hydroxyphenylmethacrylamide and hexyl methacrylate (55:45 mol-%, RSV value: 0.443 dl/g in dimethylformamide).

COMPARATIVE EXAMPLE C1

For comparison, copolymer (b) was used in the following formation:

| 8 | pbw | of copolymer (b) |
|---|---|---|
| 1 | pbw | of the esterification product of 1 mole of 2,3,4-trihydroxybenzophenone and 3 mole of naphtho-1,2-quinone-2-diazide-5-sulfonyl chloride and |
| 0.01 | pbw | of crystal violet base in |
| 80 | pbw | of 1-methoxy-2-propanol and |
| 20 | pbw | of butyl acetate. |

These solutions were whirler-coated onto electrolytically roughened and anodized aluminum plates which had been treated beforehand with an aqueous solution of polyvinylphosphonic acid. By adjusting the speed of rotation of the whirler, the layer thickness (dry) was brought to about 1.5 μm for all plates. The plates were then dried at 100° C. in a through-circulation cabinet for 10 minutes.

After exposure under a 5 kW metal halide lamp at a distance of 110 cm, and after a waiting time of 10 minutes the plates are developed in a solution of

| 5.3 | pbw | of sodium metasilicate × 9 H$_2$O |
|---|---|---|
| 3.4 | pbw | of trisodium phosphate × 12 H$_2$O and |
| 0.3 | pbw | of sodium dihydrogenphosphate (anhydrous) in |
| 91 | pbw | water. |

The portions of the copying layer which had been struck by the light were thereby removed, leaving the unexposed image areas behind on the plate.

Table 1 shows the copolymers used as binders and the exposure and developing times for the individual layers.

TABLE 1

| Example | Copolymers | Exposure time (s) | Developing time (s) |
|---|---|---|---|
| 1 | a | 30 | 80 |
| 2 | b | 10 | 30 |
| 3 | c | 40 | 60 |
| 4 | d | 10 | 70 |
| C 1 | b | 100 | 90 |

Table 1 clearly shows the advantages of the new mixtures with respect to light sensitivity. In all cases examined, the light sensitivity was higher by a factor of approximately 2 to 5 than in the case of conventional mixtures comprising naphthoquinonediazides.

After inking with olephilic printing ink, the printing forms thus prepared were used to prepare 100,000 satisfactory prints in an offset printing machine.

EXAMPLES 5 TO 8

To prepare a positive dry resist, each of the following binders were mixed, in accordance with the directions concerning coating solutions A and B, with the respective components of those coating solutions, as indicated in Table 2:

(e) copolymer of resorcinol monomethacrylate and 2-ethylhexyl methacrylate (68:32 mol-%), RSV value: 0.589 dl/g in dimethylformamide), (f) copolymer of hydroquinone monoacrylate and butyl methacrylate (65:35 mol-%, RSV value: 0.323 dl/g in dimethylformamide), (g) copolymer of hydroquinone monomethacrylate, hexyl methacrylate and butyl acrylate (65:25:10 mol-%, RSV value: 0.554 dl/g in dimethylformamide), and (h) copolymer of m-hydroxyphenylmethacrylamide, hexyl methacrylate and 1,1,2,2-tetrahydroperfluorodecyl acrylate (55:40:5 mol-%, RSV value: 0.448 dl/g in dimethylformamide).

COMPARATIVE EXAMPLE C2

For comparison, copolymer (g) was used in the following formulation:

| | | |
|---|---|---|
| 40 | pbw | of copolymer (g), |
| 8 | pbw | of the esterification product of 1 mole of 2,3,4-trihydroxybenzophenone and 3 mole of 1,2-naphtho-quinone-2-diazide-5-sulfonyl chloride and |
| 0.05 | pbw | of crystal violet base in |
| 80 | pbw | of butanone and |
| 20 | pbw | of ethanol. |

Each of the solutions of Examples 5 to 8 and of Comparative Example C2, respectively, were whirler-coated onto 26 μm thick, biaxially drawn and heat-set polyethylene terephthalate films, and then were dried at 100° C. in the through-circulation cabinet for 10 minutes. The speed of the whirler was regulated so as to obtain a layer thickness of about 25 μm. As protection against dust and scratching, a polyethylene film was additionally laminated on top of each dried layer.

The dry resists thus prepared with the mixtures of the present invention exhibited a distinctly improved flexibility compared with the dry resist comprising naphthoquinonediazide. While the latter easily broke or cracked, these disadvantages did not arise in the dry resists produced according to the present invention.

To prepare circuit boards, the above-described dry resists, after the cover film had been pulled off, were laminated in a commercially available laminator onto a cleaned, preheated base comprising an insulating board with a 35 μm-thick copper layer. Removal of the base film and optional drying thereafter was followed by exposure under a master to a 5 kW metal halide lamp at a distance of 110 cm and, after a waiting time of 10 minutes, by development in the developer specified in the Examples 1 to 4. Table 2 shows the typical exposure and developing times that were required.

TABLE 2

| Example No. | Copolymer | Coating solution | Exposure time (s) | Developing time (s) |
|---|---|---|---|---|
| 5 | e | B | 10 | 70 |
| 6 | f | A | 10 | 50 |
| 7 | g | A | 10 | 80 |
| 8 | h | B | 15 | 70 |
| C 2 | g | — | 100 | 80 |

These examples likewise show the increased light sensitivity of the new mixtures compared with those used to prepare naphthoquinonediazide layers.

Resist stencils produced in accordance with the present invention have an excellent electroplating resistance, particularly in the case of the electroplating buildup of copper and Pb/Sn alloys. Boards treated in this way can subsequently be subjected to renewed exposure and development. By this procedure it is possible, in a first step, to electroplate Pb/Sn solder pads at the drilled holes, and in a second exposure and developing steps the circuit path image can then be transferred to the still light-sensitive resist stencil. Etching of the bared copper with ammoniacal Cu(II) chloride solution gives a circuit board embodying copper technology, i.e., the Pb/Sn alloy is built up only where it is required in the subsequent soldering process.

EXAMPLES 9 TO 13

To prepare microelectronic circuit elements characterized by high integration, the following binders were mixed, in accordance with the directions concerning coating solutions C and D, with the respective components of those coatings solutions, as indicated in Table 3:

(h) copolymer of 3-hydroxynaphth-2-yl methacrylate and styrene (86:14 mol-%, RSV value: 0.213 dl/g in dimethylformamide), (i) copolymer of 2-hydroxy-3-(2-hydroxy-3-naphthyloxy)-propyl methacrylate and styrene (60:40 mol-%, RSV value: 0.383 dl/g in dimethylformamide), (k) homopolymer of pyrocatechol monomethacrylate (RSV value: 0.460 dl/g in dimethylformamide), (l) homopolymer of the reaction product of 2-hydroxy-ethyl methacrylate and 3-methylsalicylic acid (RSV value: 0.339 dl/g in dimethylformamide), and (m) copolymer of hydroquinone monomethyacrylate and biphen-4-yl methacrylate (90:10 mol-%, RSV value 0.476 dl/g in dimethylformamide).

TABLE 3

| Example | Polymer | Coating solution |
|---|---|---|
| 9 | h | C |
| 10 | i | D |
| 11 | k | C |
| 12 | l | D |
| 13 | m | C |

After filtration through a (millipore) filter having a pore diameter of 0.2 μm, each of the photoresist solutions was whirler-coated onto a commercial silicon wafer which had been provided with an 0.2 μm-thick $SiO_2$ layer by oxidation. By varying the speed of rotation, the layer thicknesses were adjusted to about 0.9 μm to 1.2 μm.

The wafers thus coated were dried at 90° C. for 30 minutes. After cooling down and conditioning in the defined atmosphere of 23° C. and 40–50% relative humidity, the wafers were exposed for about 1 second under a commercially available chromium mask in a contact exposure apparatus. Development took place at 25° C. in a moving developer comprising:

2.67% of sodium metasilicate×9$H_2O$,
1.71% of trisodium phosphate×12$H_2O$,
0.17% of sodium dihydrogenphosphate (anhydrous), dissolved in 95.45% of fully demineralized water.

Due to the good film-forming properties of the binder, the adhesion and, hence, the etch resistance on etching with $NH_4F$-buffered hydrofluoric acid were distinctly improved. The resolution of the patterns produced using the above-mentioned mixtures according to the present invention was 1 to 2 μm.

EXAMPLES 14 AND 15

Plates of electrolytically roughened and anodized aluminum pretreated with polyvinylphosphonic acid were coated with 2.5 μm-thick layers of coating solution A. The binders used in each case were as follows:

(n) copolymer of resorcinol monomethacrylate and 2-ethylhexyl methacrylate (68:32 mol-%, RSV value: 0.478 dl/g in dimethylformamide), and (o) copolymer of hydroquinone monomethacrylate and hexyl methacrylate (72:28 mol-%, RSV value: 0.461 dl/g in dimethylformamide).

These layers were imagewise irradiated, in a commercially available laser irradiator, with an argon ion laser at 10 $mJ/cm^2$. The irradiated parts of the layer were subsequently removed within 90 seconds with the developer of Examples 1 to 4. When nonirradiated areas were inked with oleophilic ink, a printing form was obtained having a better coating quality and ink acceptance relative to naphthoquinonediazide layers.

What is claimed is:

1. A radiation-sensitive mixture comprising:
(A) a water-insoluble polymeric binder which is soluble in aqueous alkaline solutions and has phenolic hydroxyl side groups and
(B) a combination of
(1) a halogen-containing, radiation sensitive compound which forms a strong acid under the action of actinic radiation and
(2) a compound which has at least one acid-cleavable C—O—C bond and the solubility of which in a liquid developer is increased by the action of acid,
wherein said binder comprises a polymer comprised of repeat units represented by the formula

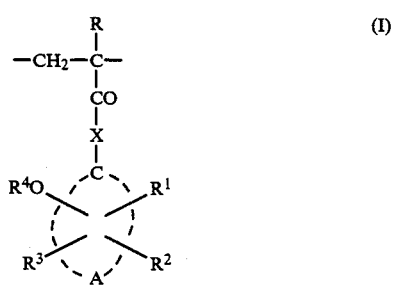

(I)

where

R is a hydrogen or a halogen atom, a cyanide group or an aliphatic hydrocarbon group of 1–4 carbon atoms, wherein said aliphatic hydrocarbon group is selected from branched and unbranched, saturated and unsaturated groups which can be substituted by halogen atoms or hydroxyl groups, or which contain ether or keto groups, $R^1$, $R^2$, $R^3$ are identical or different, and each denotes a hydrogen or a halogen atom, an alkoxycarbonyl group, an acyl group, an aroyl group or a hydrocarbon group selected from branched and unbranched, saturated and unsaturated groups with cyclic and open chains which can be substituted by halogen atoms or hydroxyl groups, or which contain ether or keto groups, $R^4$ is a hydrogen atom or a divalent organic group which is linked intermolecularly or intramolecularly to another unit represented by formula (I), $R^4$ being a hydrogen atom in at least 80 mol-% on average of units represented by formula (I), X denotes an oxygen atom or one of the groups $NR^8$, $OCH_2CHOHCH_2OCO$, $OCH_2CH_2O$ and $OCH_2CH_2OCO$, where $R^8$ is a hydrogen atom, alkyl or aryl group and A denotes the atoms required for completing a mononuclear or dinuclear carbocyclic or heterocyclic aromatic ring system.

2. The radiation-sensitive mixture as claimed in claim 1, wherein said binder further comprises units represented by the formula

(II)

where $R^5$ is a hydrogen or a halogen atom or an aliphatic hydrocarbon group, $R^6$ is an alkyloxycarbonyl, acyl, acyloxy, aryl, formyl, cyanide, carboxyl, hydroxyl, or aminocarbonyl or aliphatic hydrocarbon group and $R^7$ is a hydrogen atom or a carboxyl group which can be bonded to $R^6$, when $R^6$ is a carboxyl group, to form an acid anhydride.

3. The radiation-sensitive mixture as claimed in claim 1, wherein A denotes the carbon atoms required for completing a benzene ring.

4. The radiation-sensitive mixture as claimed in claim 1, wherein said polymer has a molecular weight $\overline{M}_n$ of 1000 to 200,000.

5. The radiation-sensitive mixture as claimed in claim 1, wherein said polymer comprises 20 to 100 mol-% of units of formula.

6. A radiation-sensitive recording material with a base material and a radiation-sensitive recording layer provided on said base material, said recording layer comprising:

(A) a water-insoluble polymeric binder which is soluble in aqueous alkaline solutions and has phenolic hydroxyl side groups and (B) a combination of
(1) a halogen-containing, radiation-sensitive compound which forms a strong acid under the action of actinic radiation and (b) a compound which has at least one acid-cleavable C—O—C bond and the solubility of which in a liquid developer is increased by the action of acid, wherein said binder comprises a polymer comprising repeat units represented by the formula

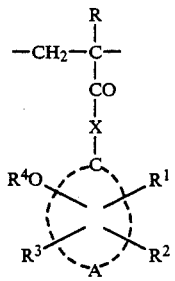

where
- R is a hydrogen or a halogen atom, a cyanide group or an aliphatic hydrocarbon group of 1–4 carbon atoms, wherein said aliphatic hydrocarbon group is selected from branched and unbranched, saturated and unsaturated groups which can be substituted by halogen atoms or hydroxyl groups, or which contain ether or keto groups,
- $R^1$, $R^2$, $R^3$ are identical or different, and each denotes a hydrogen or a halogen atom, an alkoxycarbonyl group, an acyl group, an aryloxy group, an aroyl group or a hydrocarbon group selected from branched and unbranched, saturated and unsaturated groups with cyclic and open chains which can be substituted by halogen atoms or hydroxyl groups, or which contain ether or keto groups,
- $R^4$ is a hydrogen atom or a divalent organic group which is linked intermolecularly or intramolecularly to another unit represented by formula (I), $R^4$ being a hydrogen atom in at least 80 mol-% on average of units represented by formula (I),
- X denotes an oxygen atom or one of the groups $NR^8$, $OCH_2CHOHCH_2OCO$, $OCH_2CH_2O$, and $OCH_2CH_2OCO$, where $R^8$ is a hydrogen atom, alkyl or aryl group and
- A denotes the atoms required for completing a mononuclear or dinuclear carbocyclic or heterocyclic aromatic ring system.

7. A process for preparing relief images, comprising the steps of (1) imagewise irradiating a radiation-sensitive recording material as claimed in claim 6 with actinic radiation such that the solubility of the recording layer in an aqueous alkaline developer solution increases and (2) removing irradiated portions of the recording layer by means of an aqueous alkaline developer solution.

* * * * *